United States Patent [19]
Takagi et al.

[11] 3,940,288
[45] Feb. 24, 1976

[54] METHOD OF MAKING A SEMICONDUCTOR DEVICE

[75] Inventors: Mikio Takagi; Hajime Kamioka, both of Tokyo; Kazufumi Nakayama, Kawasaki; Haruo Shimoda, Tama, all of Japan

[73] Assignee: Fujitsu Limited, Kawasaki, Japan

[22] Filed: May 10, 1974

[21] Appl. No.: 468,876

[30] Foreign Application Priority Data
May 16, 1973  Japan................................ 48-54434
May 24, 1973  Japan................................ 48-58404

[52] U.S. Cl. .................... 148/1.5; 148/187; 357/91
[51] Int. Cl.² ...................................... H01L 21/265
[58] Field of Search ........ 148/1.5, 187, 188; 357/91

Primary Examiner—L. Dewayne Rutledge
Assistant Examiner—J. Davis
Attorney, Agent, or Firm—Staas & Halsey

[57] ABSTRACT

A method of making a semiconductor device capable of high-speed operation is disclosed in which when the current gain-bandwidth is increased by the formation of a shallow base region. A side etching process is used to decrease the base spreading resistance and to allow ease in the formation of an emitter region of fine pattern. When the emitter region is formed by using polycrystalline silicon as a source of impurity diffusion, that area of an insulating film on a semiconductor substrate which adjoins the polycrystalline silicon is removed before the impurity diffusion so as to prevent an abnormal diffusion phenomenon.

19 Claims, 47 Drawing Figures

FIG. IE
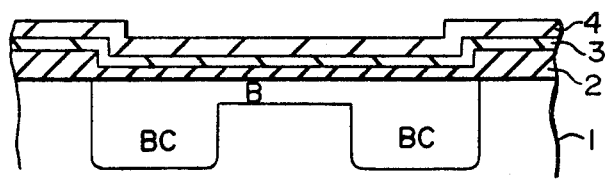
FIG. IF
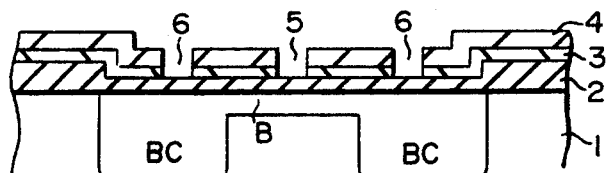
FIG. IG
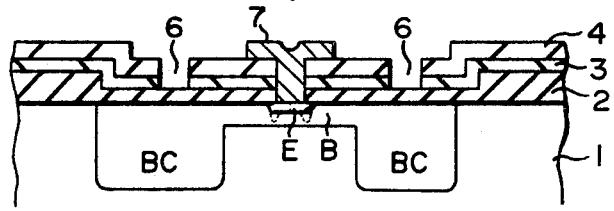
FIG. IH
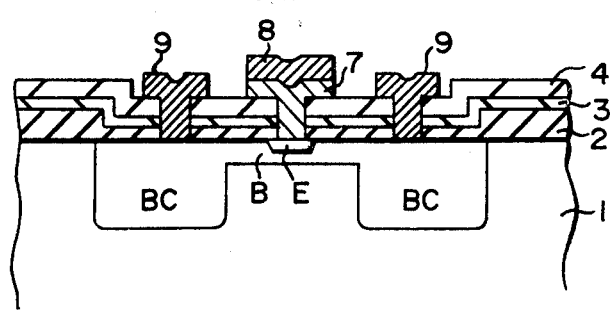

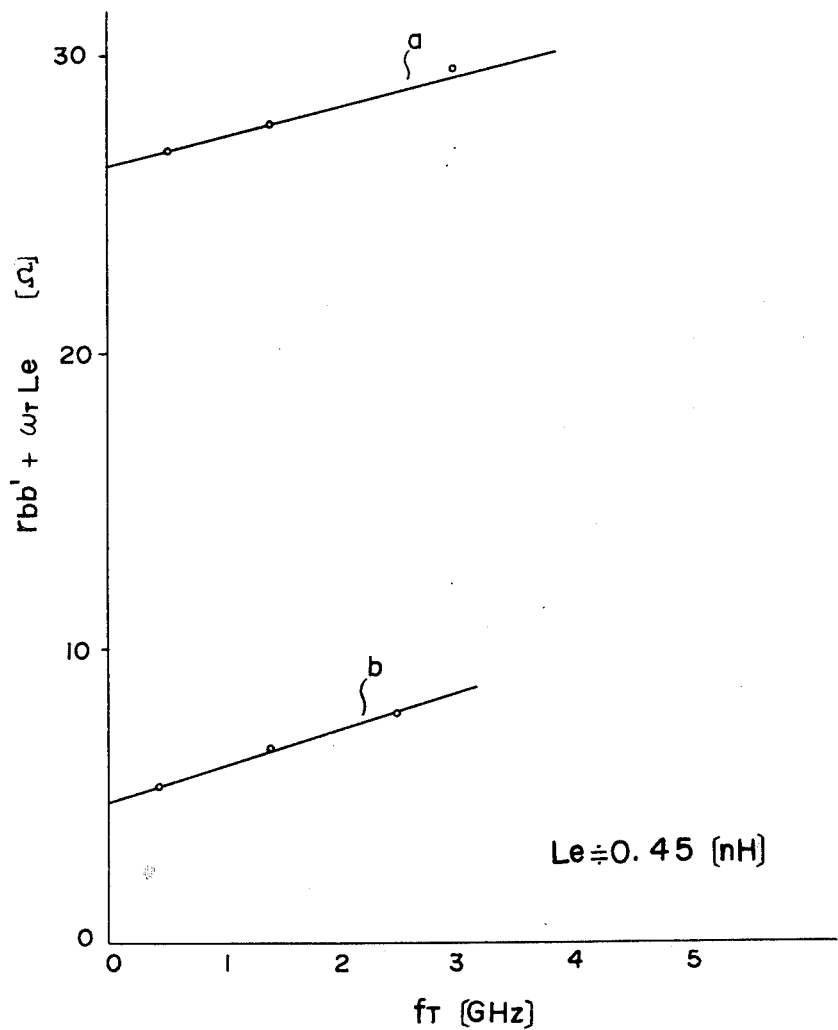

METHOD OF MAKING A SEMICONDUCTOR DEVICE

BACKGROUND OF THE INVENTION

FIELD OF THE INVENTION

This invention relates to a method of making a semiconductor device, and more particularly to an improved method for fabrication of a semiconductor device capable of high speed operation.

DESCRIPTION OF THE PRIOR ART

In order to increase the operational speed of semiconductor devices such as a transistor, an integrated circuit and so on, it is necessary to increase the current gain-bandwidth $f_T$. It is considered that the current gain-band-width $f_T$ may be increased by forming a base region to a small depth. However, with such a shallow base region, the base spreading resistance $\gamma_{bb}'$ increases, making it impossible to increase the figure of merit at high frequencies.

One of conventional types of methods for the manufacture of transistors is such, for example, as shown in FIGS. 1A to 1H. At first, an epitaxial layer 1b of about 5μ thick is formed on an n-type silicon semiconductor substrate 1a having a resistivity of about 0.01 ω-cm and, by thermal oxidation, an insulating film 2 of $SiO_2$ of about 6000A is formed on the surface of the epitaxial layer 1b.

Then, the insulating film 2 is selectively removed to form windows, through which boron is diffused into the substrate 1a to provide a base contact region BC, as illustrated in FIG. 1B.

Next, as shown in FIG. 1C, the insulating film 2 overlying the base contact region BC and extending therebetween is etched away and then boron is diffused to form a base region B as depicted in FIG. 1D.

Following this, a $Si_3N_4$ film 3 and a $SiO_2$ film 4 are formed by the CVD method, as shown in FIG. 1E. Then, the films 3 and 4 are selectively removed to provide windows 5 and 6 for the formation of an emitter and a base, as depicted in FIG. 1F. The entire surface of the substrate assembly except the window 5 is covered with the photo resist and the $SiO_2$ film 2 underlying the window 5 is etched away with hydrofluoric acid (HF) to expose the surface of the substrate.

Thereafter, polycrystalline silicon containing, for example, arsenic (As) is grown over the entire surface of the substrate assembly and then patterned in the pattern of an emitter electrode to obtain such a construction as shown in FIG. 1G. Then, the substrate assembly is heated up to 1000°c to diffuse arsenic (As) from the polycrystalline 7 into the base region B, providing an emitter region E.

Next, the area of the $SiO_2$ film 2 exposed through the window 6 is removed by the wash-out method to extend the window 6 down to the surface of the substrate 1a. The entire surface of the assembly is then deposited with aluminum by evaporation and subjected to patterning to provide the construction depicted in FIG. 1H. Reference numeral 8 indicates an emitter electrode and 9 designates a base electrode.

The base spreading resistance $\gamma_{bb}'$ of such a transistor as described above is expressed by the following equation as shown in FIG. 2:

$$\gamma_{bb}' = \gamma 1 + \gamma 2 + \gamma 3 + \gamma 4$$

where γ1 is the resistance in the area extending from the emitter electrode 8 to the boundary between it and the emitter region E; γ2 is the resistance of the base region B from the boundary between it and the emitter region E to the boundary between it and the base contact region BC; γ3 is the resistance in the base contact region BC; and γ4 is the reistance in the area extending from the base contact region BC to the base electrode 9.

FIG. 3 shows one example of the relationship among the depth Xj(A) of the base region B, a maximum current gain-bandwidth $f_{Tmax}$(GHz) and the base spreading resistance $\gamma_{bb}'(\omega)$. A decrease in the depth Xj(A) of the base region B increases the maximum current gain-bandwidth $F_{Tmax}$ but also increases the base spreading resistance $\gamma_{bb}'$.

If the collector capacitance is taken as Cc, the figure of merit FM at high frequencies is expressed as follows:

$$FM = \frac{f_T}{\gamma_{bb}' Cc}$$

Accordingly, if the depth Xj of the base region B is selected such that the base spreading resistance $\gamma_{bb}'$ increases more than the current gain-bandwidth $f_T$, the figure of merit FM decreases.

The base contact region BC is formed by diffusing an impurity to high concentration so as to decrease the resistance γ3 which is one part of the base spreading resistance $\gamma_{bb}'$. Further, if the base region B is shallow, the resistance γ2 is dependent upon the distance α between the emitter region E and the base contact region BC. Accordingly, the base spreading resistance $\gamma_{bb}'$ can be reduced by decreasing the distance α. However, as described previously with regard to FIGS. 1A to 1H, after the base contact region BC and the base region B are formed, the window for the formation of the emitter is formed by photoetching and then the diffusion process is achieved to provide the emitter region E, so that the accuracy of the mask and the accuracy of its positioning in the photoetching process impose some limitation on the distance α and it is generally difficult to reduce the distance α shorter than 2μ. Further, by decreasing the width of the emitter region E, the high frequency characteristic can be improved but, for the same reason as described above, it is difficult to decrease the width shorter than 2μ.

The impurity concentration of the base contact region BC is selected about 1~5 × $10^{20}$ atoms/cm³. The formation of such a high impurity concentration region near the baseemitter junction leads to the lowering of its withstand voltage. In order to decrease the distance α between the emitter region E and the base contact region BC, it is necessary for the impurity concentration of the area adjoining the emitter-base junction to be reduced to about 1 × $10^{19}$ atoms/cm³.

Moreover, in the process shown in FIG. 1G, abnormal diffusion called enhanced diffusion occurs at the boundary between the window for diffusion and the $SiO_2$ film 2 in the formation of the emitter region E by impurity diffusion, as indicated by broken lines. This abnormal diffusion presents a problem, for example, in the case where the base region B is formed shallow for increasing the current gain-bandwidth $f_T$. Namely, in some cases, even if the emitter region E is formed by diffusing an impurity to a predetermined depth, one part of the emitter region E extends through the base region B due to the abnormal diffusion to short-circuit the emitter and the collector. The phenomenon of such abnormal diffusion often occurs in the case where polycrystalline silicon is used as a source of diffusion but it also occurs in the cases of employing PO, $Cl_3$, $P_2O_5$, PSG, ASG, etc.

SUMMARY OF THE INVENTION

This invention is intended to overcome the aforesaid defects experienced in the prior art and has for its object to provide a method of making a semiconductor device capable of high-speed operation.

Another object of this invention is to provide a method of making a semiconductor device which settles various problems raised by the formation of a shallow base region.

Still another object of this invention is to provide a method of making a semiconductor device with which it is possible to form more minute patterns than those obtainable with the photoetching process.

The semiconductor device manufacturing method of this invention includes a process in which a window, larger than an emitter region which will be ultimately formed, is formed in an insulating film formed on the surface of a semiconductor substrate, having a base region formed therein. A polycrystalline silicon layer containing a diffused impurity is formed on the base region in the window; and the impurity contained in the polycrystalline silicon layer is diffused by heat treatment into the base region to form the emitter region.

The objects and effects of this invention will become more apparent from the following description taken in conjunction with the accompanying drawings.

BRIEF DESCRIPTION OF THE DRAWINGS

FIGS. 1A to 1H, inclusive, are schematic cross-sectional views, explaining one prior art example of the steps heretofore employed in the manufacture of a semiconductor device;

FIG. 11 is a graph comparing the relationships of $\gamma_{bb}'+ W_T Le$ to $f_T$ in the example of the prior art with the example of this invention.

DESCRIPTION OF THE PREFERRED EMBODIMENTS

Figure 4A:
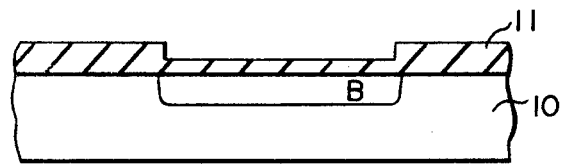
FIGS. 4A to 4E, inclusive, show the steps employed in producing a semiconductor device according to a first example of this invention.

FIGS. 4A to 4E, inclusive, illustrate one example of the steps employed in producing a semiconductor device according to this invention. A base region B and a base contact region (not shown) can be formed by known means in a silicon semiconductor substrate 10. In FIG. 4A, reference numeral 11 indicates a silicon dioxide ($SiO_2$) film. The base region B is covered with the silicon dioxide film formed during impurity diffusion.

Figure 4B:
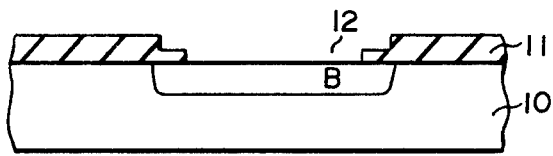

The silicon dioxide film 11, overlying the base region B, is selectively removed to form a window 12, shown in FIG. 4B to be larger in area than the emitter region subsequently formed. The formation of the window 12 can be effected by usual photoetching techniques. The silicon dioxide film 11 is about 1000A thick on the base region B and about 6000A thick in other areas. Therefore, by etching the silicon dioxide film 11 with an etchent for silicon dioxide (for example, hydrofluoric acid by the wash-out method), it is possible to form the window 12 only on the base region B.

Figure 4C:
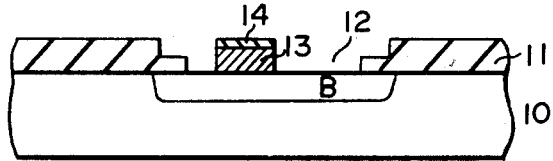

The following steps result in the construction shown in FIG. 4C. A polycrystalline silicon layer is formed on the entire area of the upper surface of the substrate assembly; followed by a silicon nitride ($Si_3N_4$) film and a silicon dioxide ($SiO_2$) film formed by the CVD method on said polycrystalline silicon layer. In the case of forming an NPN transistor, a polycrystalline silicon layer, containing arsenic (As), can be formed at a speed of 300A/min.; by selecting, for example, the molar ratio of $AsH_3$ to $SiH_4$ to be $3.6 \times 10^{-2}$; and by thermal decomposition at 700°c. The thickness of the polycrystalline silicon layer is selected in the range of 3000 to 5000A, where the impurity concentration of the emitter region is $2 \times 10^{20}$ atoms/$cm^3$. It is sufficient that the impurity concentration of the polycrystalline silicon layer be $6.5 \times 10^{20}$ atoms/$cm^3$. Further, by selecting the molar ratio of $PH_3$ to $SiH_4$ to be $2.8 \times 10^{-2}$ and by thermal decomposition at 700°c, a polycrystalline silicon layer having an impurity concentration of $4 \times 10^{20}$ atoms/$cm^3$ and containing phosphorus (P) can be formed at a speed of 500A/min. Similarly, in the case of a PNP transistor, a polycrystalline silicon layer containing boron (B), is formed.

It is possible to form the polycrystalline silicon layer 2000A thick; the silicon nitride film 1500A thick; and the silicon dioxide film thereon 2000A thick.

Next, the uppermost silicon dioxide film is selectively etched away, by hydrofluoric acid (Hf), for example, in the pattern of the emitter region; and the silicon nitride film is selectively etched away, for example, by phosphoric acid ($H_3PO_4$), for example, through the remaining silicon dioxide film serving as an etching mask. Thereafter, the polycrystalline silicon layer is selectively etched away, through the silicon nitride film serving as an etching mask, by an etchent composed of, for example, $HNO_3$, HF and $CH_3COOH$ in the ratio of 3:1:10. With this etchent, the polycrystalline silicon, the silicon dioxide and the silicon nitride are etched away at speeds of 1500A/min., 150A/min. and 100A/min., respectively. Therefore, the above steps result in the construction shown in FIG. 4C. Reference numeral 13 designates the polycrystalline silicon layer and 14 identifies the silicon nitride film. The silicon dioxide on the silicon nitride film 14 has been removed by the wash-out method.

Figure 4D:
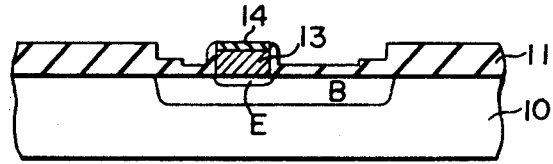

Thereafter, a heat treatment referred to as "drive in" is achieved in an oxidizing atmosphere at a temperature of 1000° to 1050°c, by which the impurity is diffused from the polycrystalline silicon layer 13 to form the emitter region E, as depicted in FIG. 4D. In this diffusion process the silicon nitride 14 serves to prevent outward diffusion from the polycrystalline silicon layer 13. Also, in this diffusion process, a silicon dioxide film is formed 2000 to 3500A thick on the remainder of the area of the window 12 and a silicon dioxide film having a thickness of less than 100A is formed on the silicon nitride film 14.

During the above diffusion process no abnormal diffusion occurs, since the periphery of the polycrystalline silicon layer 13 does not make contact with any insulating layer, such as in the prior art wherein a silicon dioxide film is used as a mask. This is considered to be due to the fact that, in the diffusion by the heat treatment, distortion due to the difference in the coefficient of thermal expansion among the semiconductor substrate 10, the polycrystalline silicon layer 13, the insulating film 11, etc. is not applied to that portion of the semiconductor substrate 10 in which the emitter region E is formed. Since no abnormal diffusion occurs, as mentioned above, it is possible to form the emitter region E in the shallow base region B, using the polycrystalline silicon layer 13 as a diffusion source.

Then, the thin silicon dioxide film on the silicon nitride film 14 is removed by the wash-out method and the silicon nitride film 14 is removed by phosphoric acid ($H_3PO_4$), thus exposing the upper surface of the polycrystalline silicon layer 13.

This is followed by the formation of a window (for forming an electrode) in the silicon dioxide film 11 on the base region B. Where the base contact region is formed as described previously, a window is formed in the silicon dioxide film 11 overlying the base contact region.

Figure 4E:
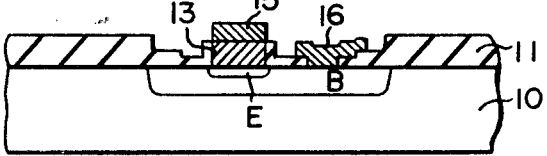

Subsequent to the formation of the window, aluminum (Al) is vapor deposited, for example, 8000A thick on the entire surface of the substrate assembly and then etched away in a desired wiring pattern, thus providing an emitter electrode 15 and a base electrode 16, as depicted in FIG. 4E.

In the formation of the emitter electrode 15, the polycrystalline silicon layer 13 used for the formation of the emitter region E, serves as a connecting electrode. Therefore, the positioning process for forming the window for the subsequent formation of the emitter connecting electrode, becomes unnecessary. This process makes it possible to form the emitter region E as narrow as 2 to 4$\mu$, or less.

The temperature for the formation of the polycrystalline silicon layer is not limited specifically to 700°c. However, since a temperature below 700°c does not cause impurity diffusion in the semiconductor substrate, it is suitable for practical purposes. In the case of growing the polycrystalline silicon layer at a higher temperature, impurity diffusion into the substrate is very slight. Therefore, if the exposed surface of the semiconductor substrate is lightly etched at the time of patterning the polycrystalline silicon layer, no problem occurs.

Further, the heat treatment may be achieved either in an oxidizing atmosphere or in a non-oxidizing atmosphere. With heat treatment in the oxidizing atmosphere, a silicon dioxide film is formed as shown in FIG. 4D.

In the above case of using the polycrystalline silicon layer as a source of impurity diffusion, with the temperature for the heat treatment in the range of about 1000° to 1050°c, impurity diffusion becomes completely solid phase-solid phase diffusion and the segregation coefficient is also about 1. Therefore, diffusion having high surface concentration is easily carried out. Furthermore, the fabrication of a minute emitter pattern becomes easier since after the diffusion treatment the polycrystalline silicon layer can be used as an electrode. Moreover, there is no possibility of abnormal diffusion, such as is caused where heat treatment for impurity diffusion is carried out using an insulating film as a diffusion mask, since the heat treatment here is effected after the polycrystalline silicon layer is formed as a source of impurity diffusion in the window area. The emitter region is easily formed in the shallow base region and no short-circuiting between the emitter and the collector occurs.

On the other hand, it has been proposed to use PSG or the like as a source of impurity diffusion. However, when the temperature for heat treatment for impurity diffusion is about 1000°c, PSG is a liquid phase. It is said that the impurity diffusion in the PSG case is usually solid phase-solid phase diffusion. However, in practice, the diffusion becomes a liquid phase-solid phase one. Furthermore, the segregation coefficient is 0.1 to 0.03 or less, when employing PSG. Therefore, in order for the emitter region to have an impurity concentration of $2\times10^{20}$ atoms/cm$^3$, the impurity concentration of PSG is required to be $5\times10^{21}$ atoms/cm$^3$. Such concentration is about 10 times higher than that where polycrystalline silicon is used. Moreover, after the diffusion treatment, no electrode can be provided to the emitter region unless the PSG used as the source of impurity diffusion is removed. The resultant manufacturing process becomes accordingly more complicated.

Figure 5A:
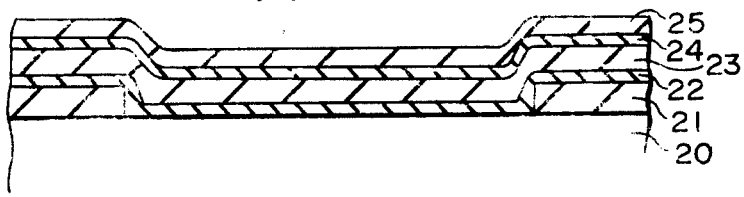
FIGS. 5A to 5G, inclusive, show the steps employed in producing a semiconductor device according to a second example of this invention, wherein a side etching step is used to determine the width of the emitter region.

FIGS. 5A to 5G, inclusive, illustrate another example of this invention. An n-type epitaxial layer having a resistivity of 0.01 $\omega$-cm is formed 5$\mu$ thick on an n-type silicon (Si) semiconductor substrate. The substrate assembly is subjected to an oxidizing treatment in a wet oxygen atmosphere at 1200°c for 30 minutes, thereby forming a silicon dioxide ($SiO_2$) film 6000A in thickness. Then, the silicon dioxide film is selectively removed, to form a window therein which will be used for the formation of a base contact region and a base region. By the CVD method, a silicon nitride ($Si_3N_4$) film 22, a silicon dioxide film 23, a silicon nitride film 24 and a silicon dioxide film 25 are formed, on said substrate, 1000A, 1000A, 1000A and 4000A in thickness, respectively said layers are illustrated in FIG. 5A. Reference numeral 20 indicates the semiconductor substrate including the epitaxial layer and 21 designates the silicon dioxide film formed by the initial heat treatment.

The silicon nitride films 22 and 24 are formed, for example, by supplying $SiH_4$ and ammonium at a temperature above 700°c. The silicon dioxide films 23 and 25 can be formed, for example, by supplying $SiH_4$ and NO at a temperature above 700°c.

Figure 5B:
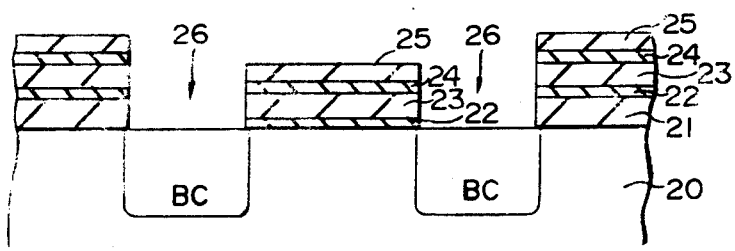

Next, as depicted in FIG. 5B, a window 26 is formed for the formation of the base contact region BC. A photo resist material is coated on the uppermost silicon dioxide film 25 and patterned; after which, the silicon dioxide film 25 is etched by hydrofluoric acid (HF), through the photo resist used as an etching mask. Then, the silicon nitride film 24 is etched by phosphoric acid ($H_3PO_4$) heated up to a temperature of 120° to 200°c, using the silicon dioxide film 25 as a mask. Thereafter, the silicon dioxide film 23 is etched by hydrofluoric acid (HF) using the silicon nitride film 24 as a mask, and then, the silicon nitride film 22 is etched by the aforementioned heated phosphoric acid ($H_3PO_4$).

Boron is diffused into the semiconductor substrate 20 through the thus formed window 26. A base contact region BC is formed, having a surface impurity concentration higher than $1 \sim 5 \times 10^{20}$ atoms/cm$^3$ and a depth of about $1\mu$.

Figure 5C:
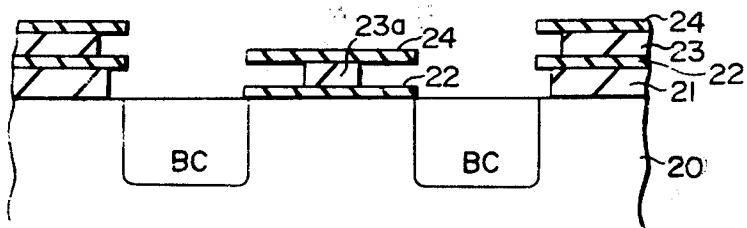

Subsequent to the formation of the base contact region BC, side etching of the silicon dioxide film 23 is achieved, as shown in FIG. 5C. The amount of the silicon dioxide film 23 etched away is selected such that the width of the remaining silicon dioxide film 23a is the desired width of an emitter region. During this side etching process, the uppermost silicon dioxide film 25 is removed. However, since the silicon dioxide film 21 is formed by thermal oxidation, the speed at which the silicon dioxide film 21 is etched by hydrofluoric acid (HF) is about ½ to ⅓ of that for the silicon dioxide films 23 and 25 formed by the CVD method. Therefore, during this side etching process, the silicon dioxide film 21 is only slightly etched.

Figure 5D:
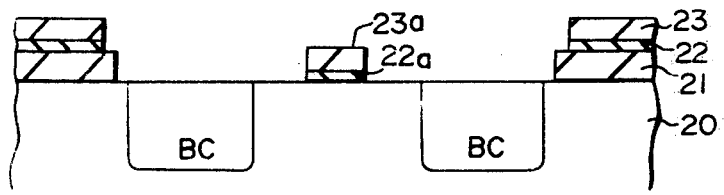

Following the side etching of the silicon dioxide film 21, the silicon nitride films 22 and 24 are etched by heated phosphoric acid ($H_3PO_4$). In this case, the silicon dioxide films 23 and 23a serve as a mask, so that even if the silicon nitride film 24 overlying them is etched away, the silicon nitride 22a remains on the area which will be ultimately occupied by the emitter region, providing such a construction as shown in FIG. 5D.

Figure 5E:
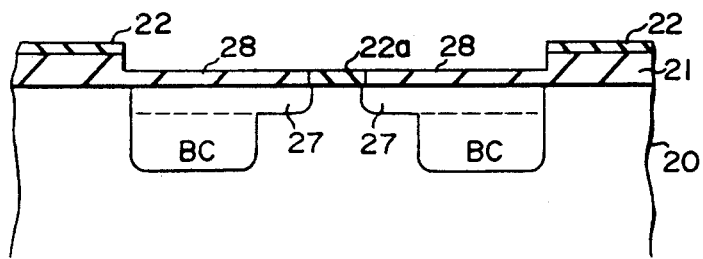

Thereafter, the silicon dioxide films 23 and 23a are washed out by using hydrofluoric acid (HF) and an impurity is diffused to form a resistance region, 27 as depicted in FIG. 5E. The surface impurity concentration of the resistance region 27 is selected to be $1 \sim 2 \times 10^{19}$atoms/cm$^3$ and its depth is about 5000A. Further, by the diffusion treatment, a silicon dioxide film 28 is formed about 4000A thick.

Figure 5F:
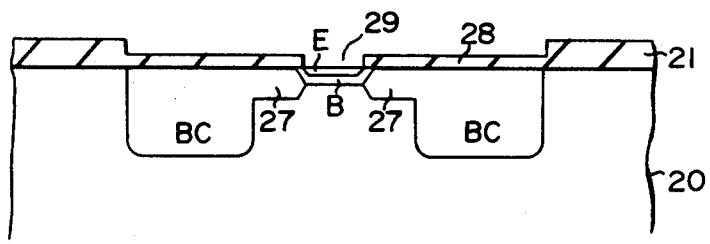
Figure 5G:
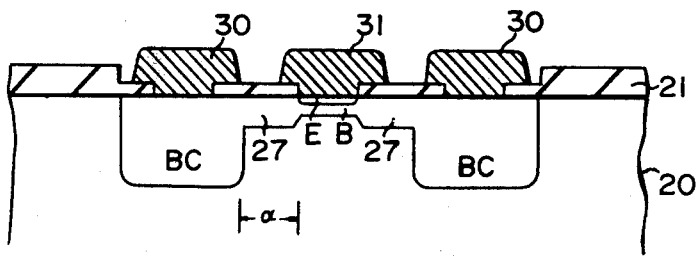

Next, the silicon nitride films 22 and 22a are washed out by using heated phosphoric acid ($H_3PO_4$) and a window 29 is formed, as depicted in FIG. 5F. Through the window 29, impurity diffusion is effected for the formation of a base region B and an emitter region E. The base region B is formed to have a depth Xj of 1000A and an impurity concentration of $1 \sim 2 \times 10^{19}$atoms/cm$^3$. By the diffusion treatment for the base region B, a silicon dioxide film is formed 500A thick in the window 29. The silicon dioxide film is washed out and an emitter impurity is then diffused through the window 29. A silicon dioxide film is again formed in window 29 and, is subsequently selectively removed at those areas to form windows which overlie the emitter region E and the base contact region BC. Then, a base electrode 30 and an emitter region 31 are formed by known means as shown in FIG. 5G.

Diffusion treatment by a vacuum capsule method, an ion implantation method, a thermal decomposition method using hydrogen boride ($B_2H_6$), etc., may be substituted so that no silicon dioxide film is formed at the area of the window 29, therefore making it unnecessary to repeat the formation of a window.

Further, it is also possible to employ the following method. Namely, after the base region B is formed, and the silicon dioxide film, formed in the window used for the formation of the base B, is washed out forming the window 29; $SiH_4$ and $AsH_3$ are caused to react with each other at 700°c to form a polycrystalline silicon layer over the entire area in the window. The polycrystalline silicon layer is patterned in the pattern of the emitter electrode; and the substrate assembly is subjected to heat treatment up to about 1000°c to diffuse arsenic (As) thereby forming the emitter region E. If the silicon dioxide film 28 around the polycrystalline silicon layer formed in the window 29 is removed prior to the abovesaid heat treatment, no abnormal diffusion occurs and a shallow base region can be obtained.

The distance $\alpha$, between the base contact region BC and the emitter region E, can be determined dependent upon the amount of side etching in the process depicted in FIG. 5C. Therefore, the distance $\alpha$ can be easily reduced, and consequently the base spreading resistance $\gamma_{bb}'$ can be lowered. Further, the width of the emitter region E can also be determined by the amount of side etching. Therefore, it is easy to form an emitter region having a width of less than $1\mu$ based on the relationship between the distance $\alpha$ and the base contact region BC. Namely, by effecting the side etching process, it is possible to form a minute pattern as compared with that obtainable only with the photo-etching process. Therefore, even if the base region B is formed shallow, the base spreading resistance $\gamma_{bb}'$ can be decreased and the width of the emitter region E can also be made very small.

Figure 6A:
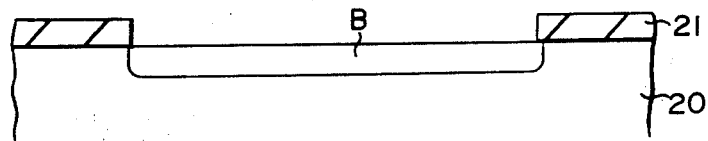
FIGS. 6A to 6E, inclusive, show a third example of the invention wherein a side etching step is employed to determine width of the emitter region.

FIGS. 6A to 6E, inclusive show another example of this invention. At first, a window is formed in a selected area of a silicon dioxide film 21 overlying a semiconductor substrate 20. An impurity is diffused, through said window, into the semiconductor substrate 20 forming a base region B, as depicted in FIG. 6A. A thin silicon dioxide film formed in said window by the above diffusion process is removed by the wash-out method.

Figure 6B:
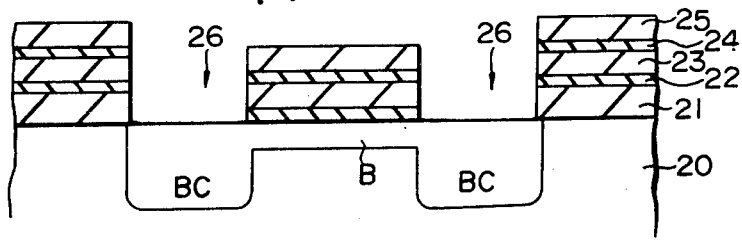

Then, as described previously in connection with FIG. 5A, a silicon nitride film 22, a silicon dioxide film 23, a silicon nitride film 24 and a silicon dioxide film 25 are formed by the CVD method over the entire surface of the substrate assembly. Then, these films are selectively removed forming a window 26, through which an impurity is diffused into the semiconductor substrate 20 to provide a base contact region BC. Such a construction is shown in FIG. 6B. A silicon dioxide film is formed in the window 26 in the above diffusion process, but for the sake of simplicity is not shown.

Figure 6C:
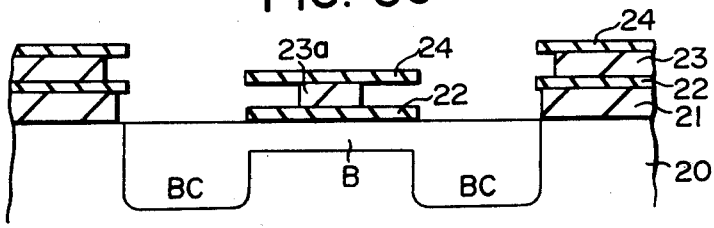

Thereafter, as described previously with regard to FIG. 5C, side etching of the silicon dioxide film 23 is carried out to provide such a construction as depicted in FIG. 6C. By this side etching process, the silicon dioxide film formed in the window 26 is almost etched away.

Figure 6D:
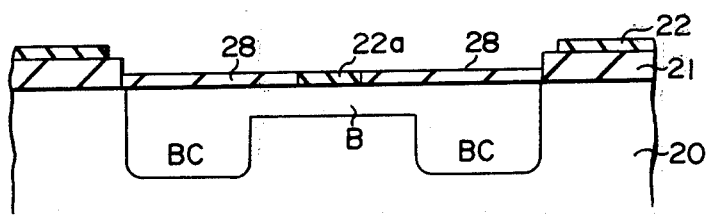

Next, by the wash-out method using heated phosphoric acid ($H_3PO_4$), the silicon nitride film 24 is completely removed and the silicon nitride film 22 is masked by the silicon dioxide films 23 and 23a and etched away only at its exposed area. Then, by the wash-out using hydrofluoric acid (HF), the silicon dioxide films 23 and 23a are removed. Heat oxidation is then achieved, thereby forming a silicon dioxide film on the area which is not covered with the silicon nitride film 22a, as illustrated in FIG. 6D.

Figure 6E:
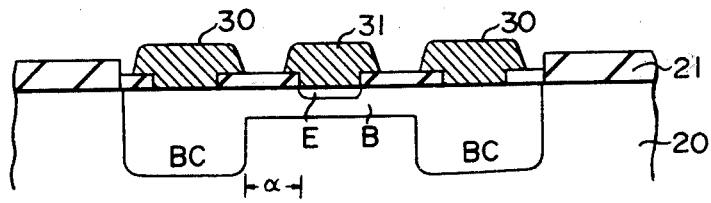

Following the above process, the silicon nitride film 22a is removed by the wash-out method to form a window. Either ordinary gas diffusion is effected, or diffusion is effected by heat treatment using polycrystalline silicon as a source of diffusion, to form an emitter region E. Then, a base electrode 30 and an emitter electrode 31 are formed as depicted in FIG. 6E.

Silicon dioxide is easier to side etch than silicon nitride. Therefore, since the silicon dioxide film formed directly on the semiconductor substrate 20 is not subjected to side etching while the silicon dioxide formed on the semiconductor substrate 20 through the silicon nitride film is subjected to side etching, the surface of the semiconductor substrate 20 is not roughened even if the amount of side etching of the silicon dioxide film is large.

In the foregoing examples, the silicon nitride film may be replaced with an aluminum oxide ($Al_2O_3$) film and the silicon dioxide film may also be replaced with a polycrystalline silicon, phosphosilicate glass (PSG), borosilicate glass (BSG) or the like.

As described above, a first insulating layer of either silicon nitride, aluminum oxide or the like, a second layer of either silicon dioxide, polycrystalline silicon or the like and a third insulating layer of the same material as the first insulating layer are sequentially formed on a semiconductor substrate. The lower layers are each patterned, using the layer immediately thereon as a mask. The second layer interposed between the first and third insulating layers is subjected to side etching; and then the first insulating layer is patterned using the second layer as a mask. Consequently, the first insulating layer can be easily patterned to a minute dimension, as compared with that obtainable with an ordinary photoetching process, and therefore, an emitter of minute pattern size can also be formed easily. Furthermore, since the distance between the emitter region and the base contact region is dependent upon the amount of side etching, this distance can be made very short regardless of the photoetching process; and when the current gain-bandwidth $f_T$ is increased by the formation of a shallow base region, the base spreading resistance $\gamma_{bb}'$ can be reduced. This provides for greatly enhanced high-frequency characteristics, coupled with the possibility of forming an emitter of minute pattern.

Figure 7A:
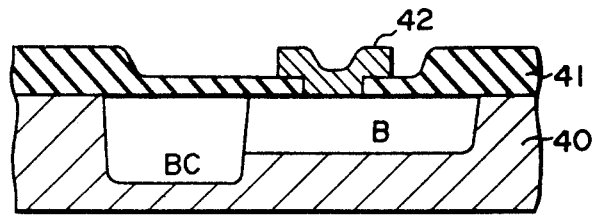
FIGS. 7A to 7D, inclusive, show a series of steps involved in the manufacture of a semiconductor device in accordance with a fourth example of this invention.

FIGS. 7A to 7D, inclusive, show a series of steps involved in the manufacture of a semiconductor device in accordance with a fourth example of this invention. As illustrated in FIG. 7A, a base region B and a base contact region BC are formed in a silicon (Si) semiconductor substrate 40. Reference numeral 41 identifies a silicon dioxide film, which is selectively removed to form therein a window for diffusing therethrough an emitter impurity. A polycrystalline silicon layer 42 is then formed over the entire area of the surface of the substrate assembly. The polycrystalline silicon layer 42 is formed 3000 to 5000A thick by the reaction of, for example, $SiH_4$ with $AsH_3$ as described previously. Then, the polycrystalline silicon layer 42 is selectively etched in such a pattern as to be larger in area than the underlying window for emitter impurity diffusion use.

Figure 7B:
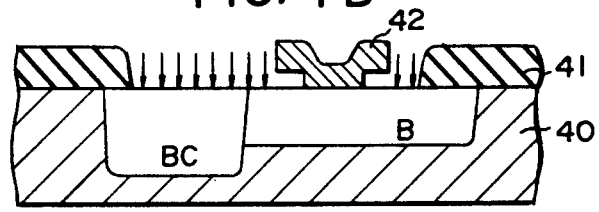

Thereafter, as depicted in FIG. 7B, the silicon dioxide film surrounding the polycrystalline silicon layer 42 is removed, for example, by using hydrofluoric acid, thus leaving the polycrystalline silicon layer 42 of umbrella configuration on the base region B.

Following this, boron (B) is injected by ion implantation. The energy for this implantation is selected to be 20 to 120KeV and the amount of dose is selected to be $10^{14}$ to $10^{16}$ atoms/cm$^3$. In this ion implantation, the impurity is prevented by the umbrella-shaped polycrystalline silicon layer 42 from being injected into the area surrounding the emitter region E. Therefore, the emitter region E is not joined with a high impurity concentration region.

Further, it is also possible to form the base contact region BC by the above-said ion implantation after the formation of the base region B. The ion implantation may also be achieved before the silicon dioxide film 41 around the polycrystalline silicon layer 42 is removed.

Moreover, the following method may also be employed. Wherein, prior to the patterning of the polycrystalline silicon layer 42, a silicon nitride film and a silicon dioxide film are formed thereon. The silicon dioxide film is patterned; and the silicon nitride film is etched through the patterned silicon dioxide film serving as a mask. The polycrystalline silicon layer 42 is etched through the remaining silicon nitride film serving as a mask. Preferably, the silicon nitride film and the silicon dioxide film are present on the polycrystalline silicon layer 42, so that no boron (B) is injected by the ion implantation into the polycrystalline silicon layer.

Figure 7C:
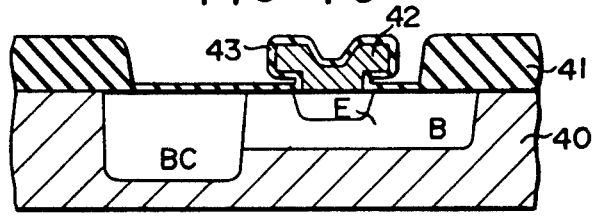

Next, the substrate assembly is subjected to heat treatment in a wet $O_2$ atmosphere at 1000°C, by which arsenic (As) is diffused from the polycrystalline silicon layer 42 into the base region B to form therein the emitter region E as shown in FIG. 7C. Reference numeral 43 represents a silicon dioxide film formed as a result of the above diffusion treatment.

As seen in FIG. 7B, where the polycrystalline silicon layer 42 is used as a source of impurity diffusion, a silicon dioxide film or like insulating film does not exist on the semiconductor substrate 40 to make contact with the periphery of the polycrystalline silicon layer 42. Therefore, no abnormal diffusion occurs. Consequently, it is possible to form the emitter region E in a shallow base region B.

By heat treatment for diffusion in the oxygen atmosphere, a silicon dioxide film is also formed on the outer peripheral surface of the polycrystalline silicon layer 42. This silicon dioxide film prevents outward diffusion of the impurity from the polycrystalline silicon layer 42 and all the impurity tends to diffuse toward the emitter region E. Accordingly, the surface impurity concentration of the emitter region E can be enhanced to about $2 \times 10^{20}$ atoms/cm$^3$. Such concentration contributes to improvement of the operating speed of transistors.

Figure 7D:
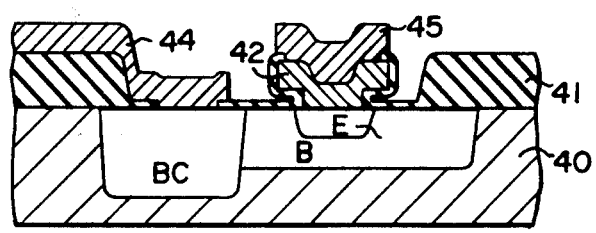

FIG. 7D shows the construction wherein a base electrode 44 and an emitter electrode 45 have been formed. The polycrystalline silicon layer 42 used as a source of impurity diffusion forms one part of the emitter electrode, and since its upper surface is larger than the width of the emitter region E, the emitter electrode 45 can be easily provided.

Figure 1A:
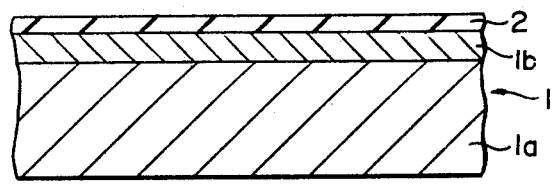
Figure 1B:
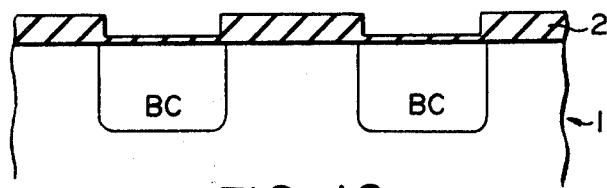
Figure 1C:
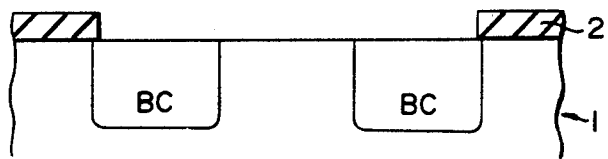
Figure 1D:
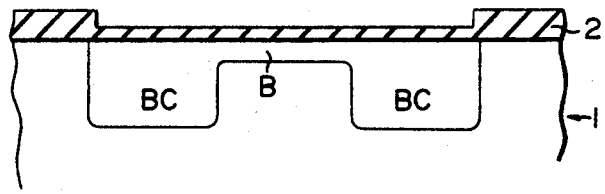
Figure 3:
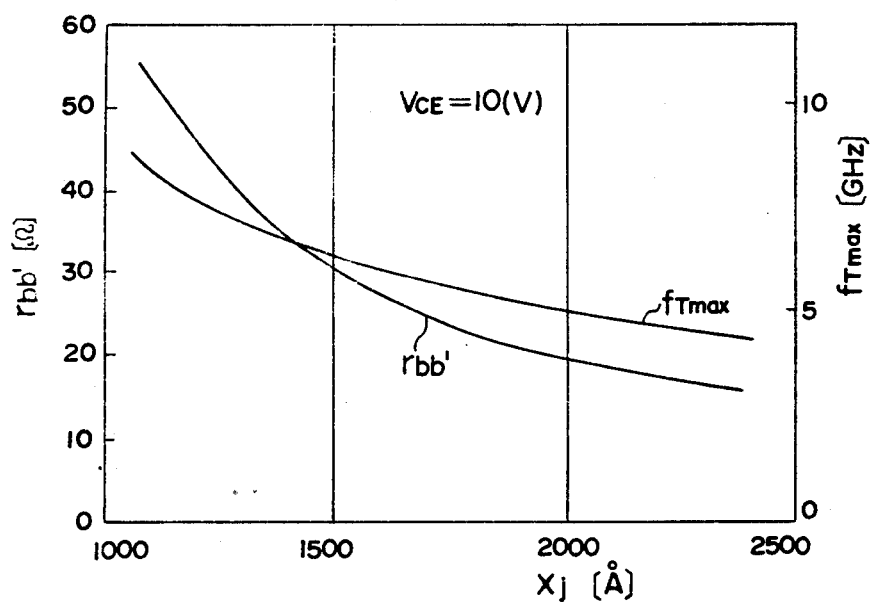
FIG. 3 is a graph showing the relationships of the base spreading resistance and the maximum current gain-bandwidth to the depth of a base region.
Figure 2:
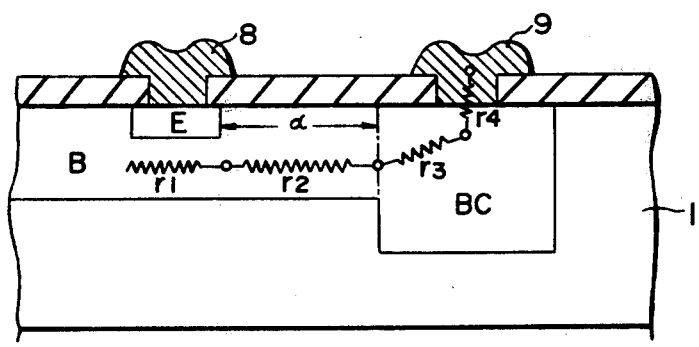
FIG. 2 is a diagram, for explaining the base spreading resistance $\gamma_{bb}'$ in a semiconductor device.
Figure 8A:
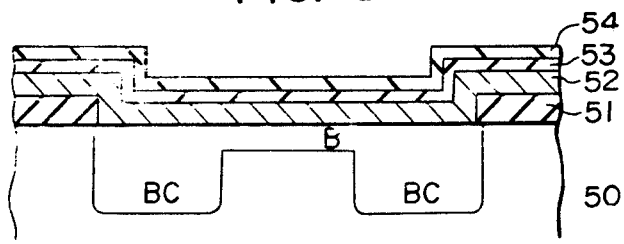
FIGS. 8A to 8D, inclusive, show a series of steps involved in the manufacture of a semiconductor device in accordance with a fifth example of this invention.

FIGS. 8A to 8D, inclusive, illustrate steps in a fifth example of this invention. After a base contact region BC and a base region B are formed, as depicted in FIG. 1D, a silicon dioxide film formed in the diffusion process is removed. Thereafter a polycrystalline silicon layer 52; a silicon nitride film 53; and a silicon dioxide film 54 are formed, as illustrated in FIG. 8A. Reference numeral 50 indicates a silicon semiconductor substrate; and 51 designates a silicon dioxide film formed by thermal oxidation.

The polycrystalline silicon layer 52 can be formed by the same means as that employed in the first example of this invention, shown in FIGS. 4A to 4E. The silicon nitride film 53 and the silicon dioxide film 54 are formed by the CVD method.

Figure 8B:
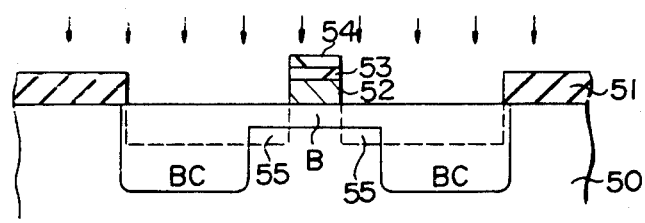

Next, as shown in FIG. 8B, the silicon dioxide film 54, the silicon nitride film 53 and the polycrystalline silicon layer 52 are removed in such a pattern as to remain only on that area in which an emitter region E will ultimately be formed. Then, boron (B) is injected by ion implantation. In such a case, the impurity is driven in to a depth greater than that of the base region B as indicated by broken lines, thus forming a resistance region 55.

Figure 8C:
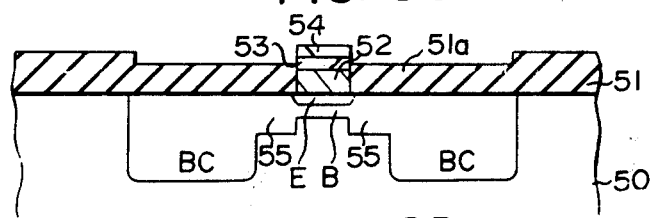

Subsequent to the formation of the resistance region 55, the substrate assembly is subjected to heat treatment in a wet $O_2$ atmosphere at 1000°c to diffuse the impurity from the polycrystalline silicon layer 52 into the base region B, providing an emitter region E as illustrated in FIG. 8C. Reference numeral 51a identifies a silicon dioxide film formed during the above impurity diffusion process.

Figure 8D:
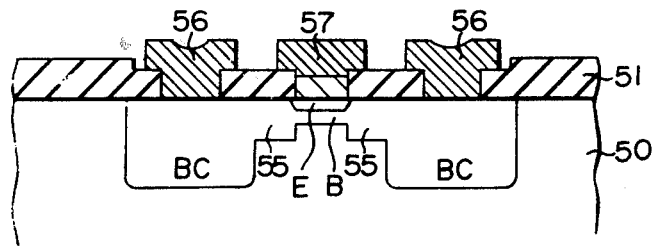

After the formation of the emitter region E, the silicon dioxide film 54 and the silicon nitride film 53 are removed to form a window on the base contact area BC and, as shown in FIG. 8D. A base electrode 56 and an emitter electrode 57 are formed of aluminum (Al) or the like.

Figure 8E:
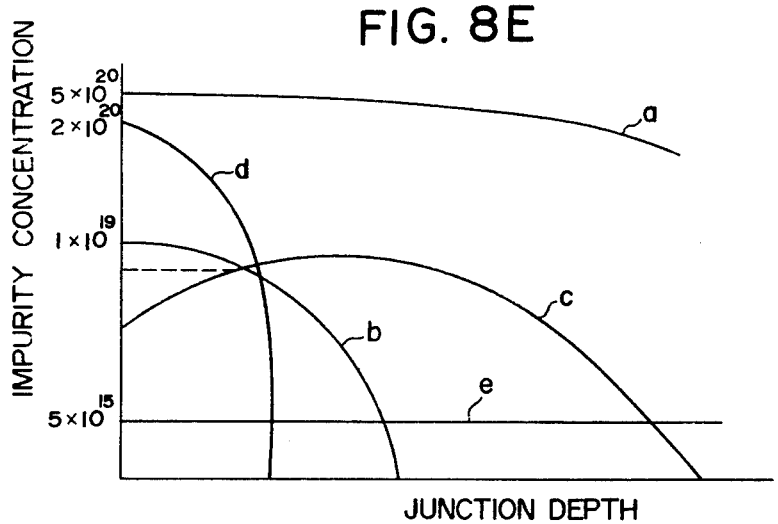
FIG. 8E is a graph showing the distribution of impurity concentration in the example depicted in FIGS. 8A to 8D.

FIG. 8E shows the distribution of the impurity concentration relative to the depth from the surface of the semiconductor substrate 50. Curves a, b, c, d and e respectively indicate distributions of the impurity concentrations in the base contact region BC, the base region B, the resistance region 55, the emitter region E and a collector region, that is, the epitaxial layer. The curve c shows the impurity concentration distribution in the resistance region 55 formed by ion implantation. It is desired to select the impurity concentration distributions such that the maximum impurity concentration of the resistance region 55 may not exceed $1 \times 10^{19}$ atoms/cm$^3$, which is also the surface impurity concentration of the base region B; and that the curve c may cross the impurity concentration distribution curve b of the base region B at substantially the same depth as that of which it crosses the impurity concentration distribution curve d of the emitter region E.

In the present example, no abnormal diffusion occurs during the emitter impurity diffusion. Further, the resistance region 55 is formed by ion implantation between the emitter region E and the base contact region BC thereby decreasing the base spreading resistance $\gamma_{bb}'$.

Figure 9A:
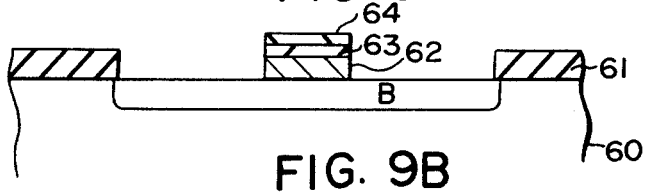
Figure 9B:
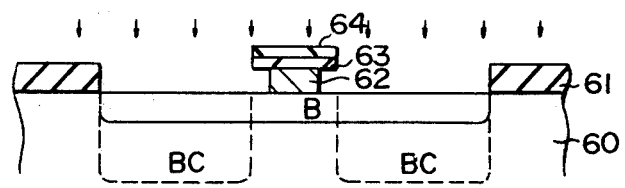
Figure 9C:
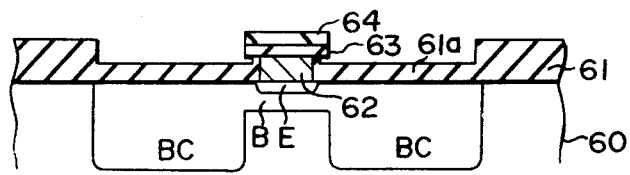

FIGS. 9A to 9C, inclusive, shows steps in a sixth example of this invention. The construction shown in FIG. 9A is obtained by the following steps. Namely, a silicon dioxide film 61, which is formed by thermal oxidation on a semiconductor substrate 60, is selectively removed to form therein a window. A base impurity is diffused through said window, into the semiconductor substrate 60, to provide therein a base region B. Then, by the reaction of SiH$_4$ with AsH$_3$, a polycrystalline silicon layer 62 containing arsenic (As) 2000A thick is formed; on which a silicon nitride film 63 1500A thick is formed by the CVD method; and, further, a silicon dioxide film 64 2000A thick is formed on the silicon nitride film 63. Thereafter, the silicon dioxide film 64, the silicon nitride film 63 and the polycrystalline layer 62 are sequentially etched to leave an island which is larger in area than an emitter region, which will be ultimately formed.

Side etching of the polycrystalline silicon layer 62 is then effected, as depicted in FIG. 9B. For this side etching, an etchent composed of HNO$_3$, HF and CH$_3$COOH in the ratio of 3:1:10 is employed. The speed at which the polycrystalline silicon layer is etched, is 1500A/min. The amount of side etching of the polycrystalline silicon layer is selected so that the width of the remaining polycrystalline silicon layer 62 agrees with the desired width of the emitter region.

Following the side etching of the polycrystalline silicon layer 62, ion implantation is achieved as is the case with the fourth and fifth example of the present invention. In this case, the silicon nitride film 63 and the silicon dioxide film 64 serve as a mask to form a base contact region BC as indicated by broken lines.

Subsequent to the ion implantation, the substrate assembly is heated in a wet O$_2$ atmosphere at 1000°c. The impurity in the polycrystalline silicon layer 62 is thereby diffused into the base region B; forming therein, the emitter region E depicted in FIG. 9C. Reference numeral 61a denotes a silicon dioxide film formed during the above heat treatment.

Thereafter, a base electrode and an emitter electrode are formed in the same manner as in the fifth example.

In this sixth example, no abnormal diffusion occurs when the emitter impurity diffusion is achieved and the emitter region can be formed in a shallow base region. Further, the side etching enables the formation of a very narrow emitter region, as compared with patterning by the photoetching process. Moreover, the distance between the base contact region BC and the emitter region E can also be selected depending upon the amount of side etching, so that the base spreading resistance $\gamma_{bb}'$ can be made small by reducing the distance.

FIGS. 10A to 10G, inclusive, show steps employed in a seventh example of this invention. A silicon dioxide film 71 is formed by thermal oxidation to about 6000A on a semiconductor substrate 70 having formed thereon an n-type epitaxial layer about 5$\mu$ in thickness. The silicon dioxide film 71 is selectively removed by ordinary photoetching techniques to form therein a window which is large enough to form a base contact region and a base region. Then, a first silicon nitride film 72, a silicon dioxide film 73, a second silicon nitride film 74 and a silicon dioxide film 75 are formed by known CVD method 1000A, 1000A, 1000A and 4000A in thickness, respectively, obtaining a construction shown in FIG. 10A, which is the same as that depicted in FIG. 5A.

After this, a window 76 for the formation of a base contact region is formed by etching in the same manner as described previously in connection with FIG. 5B. The width L$_1$, of the silicon dioxide films 73 and 75 and the silicon nitride films 72 and 74 surrounded by the window 76, is selected to be about 3$\mu$. Then, boron (B) is diffused through the window 76 into the semiconductor substrate 70 to form therein a base contact region BC$_3$ having a surface impurity concentration of $1 \times 10^{20}$ atoms/cm$^3$ and a depth of about 1$\mu$. It has been ascertained that, but this diffusion process, the impurity is also diffused in a transverse direction. The diffusion length L$_2$ is about 1$\mu$ and the impurity concentration at the position about 4$\mu$ apart in horizontal direction was about $1 \times 10^{19}$ atoms/cm$^3$.

Figure 10A:
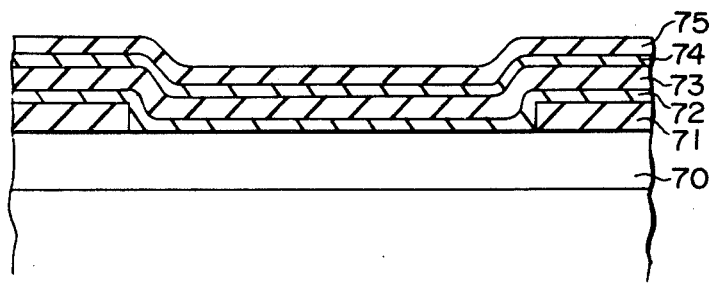
Figure 10B:
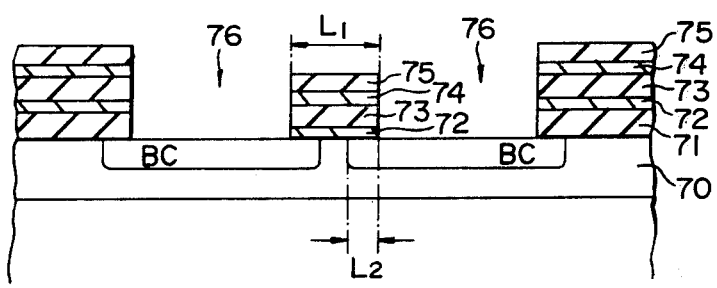
Figure 10C:
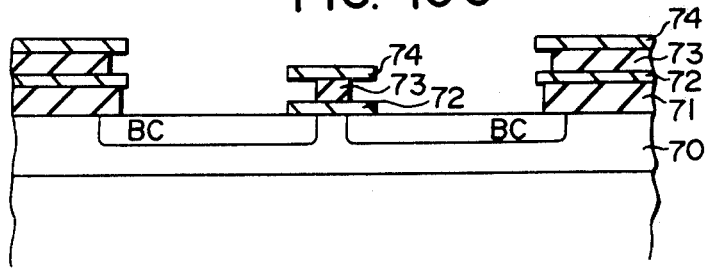

Next, the silicon dioxide film 73 is subjected to side etching, as is shown in FIG. 10C. The amount of side etching of the silicon dioxide film 73 can be selected in accordance with either the desired distance between an emitter region and the base contact region, or the desired width of the emitter region. In order to obtain a sufficient withstand voltage between the emitter and the base, it is necessary that the base contact region BC adjoins the emitter region at such a portion where the impurity concentration is $1 \times 10^{19}$ atoms/cm$^3$. Therefore, it is preferred that the amount of side etching be about 5000 to 7000A.

By the above side etching, the silicon dioxide film 75 is completely etched away. However, the silicon dioxide film 71 formed by thermal oxidation is only slightly etched, because its etching speed by hydrofluoric acid (HF) is ½ to ⅓ of that of the silicon dioxide films 73 and 75 formed by the CVD method.

Figure 10D:
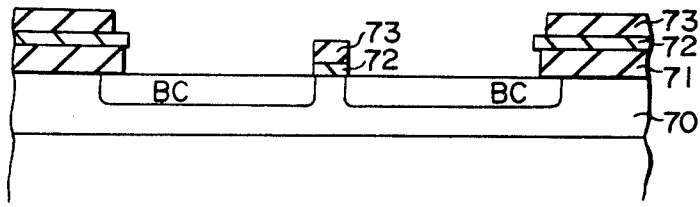

Then, the silicon nitride films 72 and 74 are etched by heated phosphoric acid ($H_3PO_4$). In this case, the silicon dioxide film 73 serves as a mask, so that the construction shown in FIG. 10D is obtained.

Figure 10E:
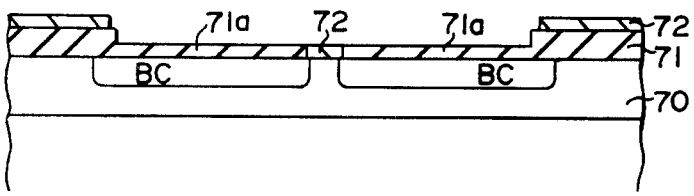

After this, the silicon dioxide film 73 is etched away by using hydrofluoric acid (HF) and a silicon dioxide film 71a is formed by thermal oxidation on the base contact region BC, as shown in FIG. 10E.

Figure 10F:
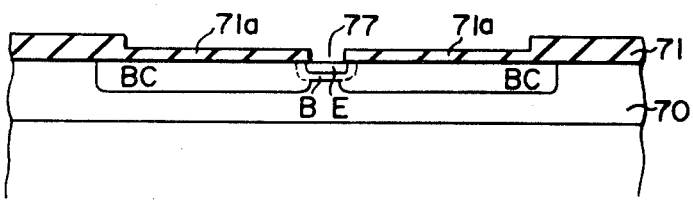

Thereafter, the silicon nitride film 72 is removed by etching to form a window 77, as depicted in FIG. 10F. An impurity is duffused therethrough, into the semiconductor substrate 70, to provide therein a base region B and an emitter region E. If the vacuum capsule method, the ion implantation method of the thermal decomposition method using hydrogen boride ($B_2H_6$) is employed, no silicon dioxide film is formed in the window 77; thereby eliminating the step of forming the window 77 again, after the above diffusion process. Further, the impurity diffusion for the emitter region may also be achieved by providing a polycrystalline layer containing the impurity.

Figure 10G:
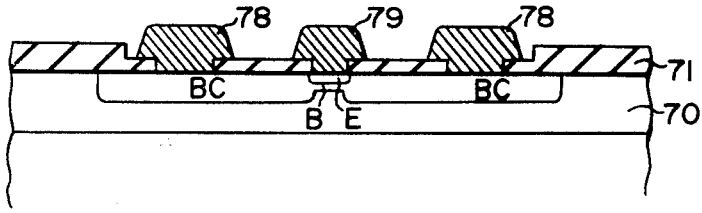

Next, a base electrode 78 and an emitter electrode 79 are formed by known means as shown in FIG. 10G.

As described above, by forming the emitter region E in the shallow base region B and by reducing the distance between the emitter region E and the base contact region BC, it is possible to obtain a transistor which has a low base spreading resistance $\gamma_{bb}'$ and a high withstand voltage between the emitter and the base.

There are some occasions when the formation of the first silicon nitride film 72 directly on the semiconductor substrate 70 exterts bad influence. To avoid this, it is possible to form the silicon nitride film 72 on a silicon dioxide film about 500A thick which is formed by thermal oxidation.

Further, since the distance $\alpha$ between the emitter region E and the base contact region BC is dependent upon the amount of side etching of the silicon dioxide film 73, this distance $\alpha$ can be easily reduced so as to decrease the base spreading resistance $\gamma_{bb}'$. The window for the formation of the emitter region E is formed by etching the first silicon nitride film 72 using the silicon dioxide film 73 left by side etching as a mask and by etching the remaining silicon nitride film 72, so that the emitter region E can be easily formed extremely narrow and a width of less than $2\mu$ can also be easily obtained by selecting the amount of side etching. Moreover, side etching of silicon dioxide is easier than that of silicon nitride and where the amount of side etching is large, sagging of the second silicon nitride film 74 overlying the silicon dioxide film 73 can be prevented by increasing a little the thickness of the film 73. It is also considered possible to effect side etching of the first silicon nitride film 72 but this is defective in that the surface of the semiconductor substrate 70 is roughened. However, the examples of this invention described in the foregoing are free from such a defect.

Further, in the foregoing examples, the silicon nitride film may also be replaced with an aluminum oxide ($Al_2O_3$) film and the silicon dioxide films 73 and 75 may also be substituted with polycrystalline silicon, phospho silicate glass (PSG), borosilicate glass (BSG) or the like.

In the seventh example described above, a first insulating layer of silicon nitride, aluminum oxide or the like; a second layer of silicon dioxide, polycrystalline silicon or the like; and a third insulating layer of the same material as the first insulating layer are sequentially formed on the semiconductor substrate. The lower layers are each patterned using the layer immediately overlying them as a mask. The second layer interposed between the first and third insulating layers is subjected to side etching; and the first insulating layer is patterned using the second layer as a mask. Accordingly, the first insulating layer thus patterned can be readily formed minute, as compared with the case of using ordinary photoetching process, and an emitter region of fine pattern can also formed with ease. Since the distance between the emitter region and the base contact region is dependent upon the amount of side etching, this distance can be made extremely short without being restricted by the photoetching process; and when the current gain-bandwidth $f_t$ is increased by using the shallow base region, the base spreading resistance $\gamma_{bb}'$ can be reduced. This greatly enhances the high-frequency characteristics, coupled with the fact that an emitter of fine pattern can be obtained.

The impurity concentration of the portion of the base contact region which adjoins the emitter region is lowered to $1 \times 10^{19}$ atoms/cm$^3$, so that a sufficient withstand voltage between the emitter and the base can be obtained. A withstand voltage between the emitter and the collector is also excellent and breakdown is more difficult.

In the foregoing examples of this invention, it is possible to adopt the following conditions for the diffusion of boron: by supplying an $N_2$ gas at the rate of 3l per minute; supplying, as carriers of $BBr_3$, an $N_2$ gas at the rate of 100cc per minute; and supplying $O_2$ at the rate of 10cc per minute. Namely, in the case of forming the base contact region BC, preheating, deposition and purge are effected for 15, 25 and 5 minutes, respectively at 1100°C. In the case of forming the base region B, preheating, deposition and purge are achieved for 15, 15 and 5 minutes, respectively at 850°c. In the case of forming the resistance region 27 (see FIG. 5E), preheating, deposition and purge are carried out for 15, 20 and 5 minutes, respectively at 950°c.

A transistor (A) produced by the conventional method shown in FIGS. 1A to 1H and a transistor (B) produced by the method of the second example of this invention depicted in FIGS. 5A to 5G, whose emitter regions E have the same width, have the following characteristics:

|  | A | B |
|---|---|---|
| $\gamma_{bb'}$ ($V_{CE}$=10V) | 27 Ω | 5 Ω |
| $f_{Tmax}$ ($V_{CE}$=10V) | 4.8GHz | 5.7GHz |
| $C_{TE}$ ($V_{BE}$=0.5V) | 3.4 pF | 3.5 pF |
| $V_{EBO}$ (10μA) | 4.8V | 5.5V |

$C_{TE}$: the capacitance of depletion layer between emitter and base $V_{BEO}$: reverse withstand voltage between emitter and base The real part $h_{11}$ of a small signal input impedance is expressed as follows:

$$h_{11} = \gamma_{bb'} + W_T Le$$

where $W_T = 2\pi f_T$ and Le is the inductance of a lead of the emitter. By plotting the resistance values at those points where the real part $h_{11}$ crosses j=0 relative to $f_T$, the results shown in FIG. 11 were obtained. The curve *a* indicates the example of the prior art method and the curve *b* this invention. As will be seen from the above table and from FIG. 11, this invention remarkedly reduces the base spreading resistance $\gamma_{bb'}$ and increases the figures of merit FM at high frequencies.

This invention is applicable not only to the control of the width of the channel not only in such bipolar transistors but also in field effect semiconductor devices (MIS-FET) and CCD (Charge Coupled Device). Further, this invention is not limited specifically to the foregoing examples but many modifications and variations may be effected without departing from the scope recited in the appended claims.

What is claimed is:

1. A method of making a semiconductor device comprising the steps of forming an insulating film on a semiconductor substrate; selectively removing said insulating film to form therein a window to expose the surface of said semiconductor substrate therethrough; forming in said window a semiconductor layer containing an impurity for diffusion, said semiconductor layer being small in area enough not to make contact with said insulating film; and diffusing the impurity by heat treatment from said semiconductor layer into said semiconductor substrate.

2. A method of making a semiconductor device according to claim 1, wherein said semiconductor layer containing the impurity for diffusion is formed of polycrystalline silicon.

3. A method of making a semiconductor device according to claim 1, further comprising the steps of selectively forming a polycrystalline silicon layer containing an impurity for an emitter on said semiconductor substrate at an area ultimately occupied by a base region; selectively removing that area of said insulating film on said semiconductor substrate which adjoins said polycrystalline silicon layer; diffusing the impurity by heat treatment from said polycrystalline silicon layer into said base region to form therein an emitter region.

4. A method of making a semiconductor device according to claim 1, further comprising the steps of selectively removing said insulating film on the surface of said semiconductor substrate having formed therein a base region to form a window larger than an emitter region ultimately obtained; forming a polycrystalline silicon layer containing an impurity for an emitter on the entire area of the surface of the substrate assembly; etching said polycrystalline silicon layer in the pattern of said emitter region; and diffusing the impurity by heat treatment from said polycrystalline silicon layer into said base region to form therein said emitter region.

5. A method of making a semiconductor device according to claim 1, further comprising the steps of selectively removing said insulating film on the surface of said semiconductor substrate having formed therein a base region to form a window for impurity diffusion for an emitter; forming a polycrystalline silicon layer containing an impurity for the emitter on the entire area of the surface of the substrate assembly; patterning said polycrystalline silicon layer to be wider than the width of the emitter region ultimately obtained; selectively etching away that area of said insulating film on said base region which adjoins said polycrystalline silicon layer to leave said polycrystalline silicon layer in the form of an umbrella on said base region; effecting ion implantation of an impurity of the same conductivity type as said base region; and diffusing the impurity in said polycrystalline silicon layer by heat treatment into said base region to form therein said emitter region.

6. A method of making a semiconductor device according to claim 1, further comprising the steps of forming an insulating film on a semiconductor substrate; selectively removing said insulating film to form therein a window to expose the surface of said semiconductor substrate therethrough; forming in said window a semiconductor layer containing an impurity for diffusion and an insulating film covering said semiconductor layer, said semiconductor layer being small in area enough not to make contact with said insulating layer formed on said semiconductor substrate; effecting ion implantation into the exposed semiconductor substrate; diffusing the impurity by heat treatment from said semiconductor layer into said semiconductor substrate.

7. A method of making a semiconductor device according to claim 6, wherein said semiconductor layer is formed of polycrystalline silicon.

8. A method of making a semiconductor device according to claim 6, wherein said insulating film on said semiconductor layer is composed of a silicon dioxide layer and a silicon nitride layer or a silicon dioxide layer and an aluminum oxide layer.

9. A method of making a semiconductor device according to claim 6, wherein said insulating film on said semiconductor layer is formed of silicon nitride or aluminum oxide.

10. A method of making a semiconductor device according to claim 1, further comprising the steps of forming a base contact region and a base region in a semiconductor substrate; exposing the surfaces of said base contact region and said base region by etching; forming a polycrystalline silicon layer containing an impurity for an emitter over the entire area of the surface of said semiconductor substrate; forming a silicon nitride or aluminum oxide film on said polycrystalline silicon layer; forming a silicon dioxide film on said silicon nitride or aluminum oxide film; etching said silicon dioxide film, said silicon nitride or aluminum oxide film and said polycrystalline silicon layer in a pattern of an emitter region ultimately formed; effecting ion implantation of an impurity of the same conductivity type as said base region; and diffusing the impurity in said polycrystalline silicon layer by heat treatment into said base region to form therein said emitter region; the impurity concentration distributions in said resistance region formed by said ion implantation, said base region and said emitter region being selected to be identical with one another at substantially the same depth from the surface of said semiconductor substrate and a maximum impurity concentration of said resistance region being selected not to exceed the surface impurity concentration of said base region.

11. A method of making a semiconductor device according to claim 1, further comprising the steps of selectively removing said insulating film on the surface of said semiconductor substrate having formed therein a base region to form a window to expose almost all of the surface of said base region therethrough; forming a polycrystalline silicon layer containing an impurity for an emitter; forming an silicon nitride or aluminum oxide film on said polycrystalline silicon layer; forming a silicon dioxide film on said silicon nitride or aluminum oxide film; patterning said silicon dioxide film, said silicon nitride or aluminum oxide film and said polycrystalline silicon layer to be wider than an emitter region ultimately obtained; subjecting said polycrystalline silicon layer to side etching to provide the width of said emitter region; effecting ion implantation of an impurity of the same conductivity type as said base region to a depth greater than said base region to form a base contact region; and effecting heat treatment to diffuse the impurity in said polycrystalline silicon layer into said base region to form therein said emitter region.

12. A method of making a semiconductor device according to claim 1, wherein said heatment for the diffusion of the impurity contained in the polycrystalline layer into said base region is achieved in an oxidizing atmosphere.

13. A method of making a semiconductor device comprising the steps of sequentially forming on a semiconductor substrate a first insulating layer, a second layer of a material different from that of said first insulating layer and a third insulating layer of the same material as that of said first insulating layer; patterning said first insulating layer, said second layer and said third insulating layer in a desired pattern; effecting side etching of said second layer; patterning said first insulating layer using said second layer as a mask; forming a layer of a material different from that of said first insulating layer to surround said first insulating layer; and selectively removing said first insulating layer to form a window to expose said semiconductor substrate therethrough.

14. A method of making a semiconductor device according to claim 13, further comprising the steps of sequentially forming on said semiconductor substrate a first insulating layer, a second layer of a material different from that of said first insulating layer and a third insulating layer of the same material as that of said first insulating layer; patterning said first insulating layer, said second layer and said third insulating layer in a desired pattern to form a window; diffusing an impurity into said semiconductor substrate through said window; effecting side etching of said second layer; patterning said first insulating layer using said second layer as a mask; forming a layer of a material different from that of said first insulating layer to surround said insulating layer; and removing said first insulating layer to form a window to expose said semiconductor substrate therethrough.

15. A method of making a semiconductor device according to claim 13, further comprising the steps of sequentially forming on said semiconductor substrate a first insulating layer, a second layer of a material different from that of said first insulating layer and a third insulating layer of the same material as that of said first insulating layer; selectively removing said first insulating layer, said second layer and said third insulating layer to form therein a window; diffusing an impurity through said window into said semiconductor substrate to form therein a base contact region; effecting side etching of said second layer to be of the same width as an emitter region ultimately formed; etching said first insulating layer using said second layer as a mask; forming an insulating film around said first insulating layer; selectively removing said first insulating layer to form therein a window; and diffusing base and emitter impurities through said window into said semiconductor substrate to provide a base region and an emitter region.

16. A method of making a semiconductor device according to claim 13, further comprising the steps of sequentially forming on said semiconductor substrate a first insulating layer, a second layer of a material different from that of said first insulating layer and a third insulating layer of the same material as that of said first insulating layer; selectively removing said first insulating layer, said second layer and said third insulating layer to form therein a window, diffusing an impurity through said window into said semiconductor substrate to form therein a base contact region; effecting side etching of said second layer to be of the same width as an emitter region ultimately formed; etching said first insulating layer using said second layer as a mask; diffusing an impurity through said first insulating layer serving as a mask to form a resistance region; selectively removing said first insulating layer to form therein a window; and diffusing impurities through said window into said semiconductor substrate to form therein a base region and an emitter region.

17. A method of making a semiconductor device according to claim 13, further comprising the steps of forming a base region in said semiconductor substrate; sequentially forming on said base region a first insulating layer, a second layer of a material different from that of said first insulating layer and a third insulating layer of the same material as that of said first insulating layers; selectively removing said first insulating layer, said second layer and said third insulating layer to form therein a window; diffusing an impurity through said window into semiconductor substrate to form therein a base contact region; effecting side etching of said second layer to be of the same width as that of an emitter region ultimately formed; etching said first insulating layer using said second layer as a mask; forming an insulating film around said first insulating layer; selectively removing said first insulating layer to form therein a window; and diffusing an impurity through said window into said semiconductor substrate to form a emitter region.

18. A method of making a semiconductor device according to claim 13, wherein said third insulating layer is etched using, as a mask, a layer formed of the same material, as that of said second layer.

19. A method of making a semiconductor device according to claim 13, wherein said first and third insulating layers are formed of silicon nitride and said second insulating layer is formed of silicon dioxide.

* * * * *

UNITED STATES PATENT AND TRADEMARK OFFICE
CERTIFICATE OF CORRECTION

PATENT NO. : 3,940,288
DATED : February 24, 1976
INVENTOR(S) : Mikio Takagi et al It is certified that error appears in the above-identified patent and that said Letters Patent are hereby corrected as shown below:

Column 1, line 27, change "$\omega$-cm" to --$\Omega$-cm--.
Column 2, line 13, change "$\omega$" to --$\Omega$--.
Column 4, line 56, delete ", for example,".
Column 6, line 43, change "0.01 $\omega$-cm" to --0.01 $\Omega$-cm--.
Column 11, line 31, change "a, b, c, d and e" to --$\underline{a}$, $\underline{b}$, $\underline{c}$, $\underline{d}$ and $\underline{e}$--.
Column 11, line 36, change "c" to --$\underline{c}$--.
Column 11, line 42, change "c" to --$\underline{c}$--.
Column 11, line 43, change "b" to --$\underline{b}$--.
Column 11, line 46, change "d" to --$\underline{d}$--.
Column 14, line 36, change "$f_I$" to --$f_T$--.
Column 15, line 20, change "a" to --$\underline{a}$--.
Column 15, line 21, change "b" to --$\underline{b}$--.

Signed and Sealed this eleventh Day of May 1976

[SEAL]

Attest:

RUTH C. MASON
*Attesting Officer*

C. MARSHALL DANN
*Commissioner of Patents and Trademarks*